(12) United States Patent
Winkler et al.

(10) Patent No.: US 10,774,422 B2
(45) Date of Patent: Sep. 15, 2020

(54) SYSTEMS AND METHODS FOR CONTROLLING VAPOR PHASE PROCESSING

(71) Applicant: ASM IP HOLDING B.V., Almere (NL)

(72) Inventors: Jereld Lee Winkler, Gilbert, AZ (US); Cheuk Li, Chandler, AZ (US); Michael F. Schultz, Mesa, AZ (US); John Kevin Shugrue, Phoenix, AZ (US)

(73) Assignee: ASM IP HOLDING B.V., Almere (NL)

( * ) Notice: Subject to any disclaimer, the term of this patent is extended or adjusted under 35 U.S.C. 154(b) by 159 days.

(21) Appl. No.: 15/996,350

(22) Filed: Jun. 1, 2018

(65) Prior Publication Data

US 2019/0368038 A1    Dec. 5, 2019

(51) Int. Cl.
*C23C 16/455* (2006.01)
*H01L 21/67* (2006.01)
*C23C 16/458* (2006.01)
*C23C 16/52* (2006.01)

(52) U.S. Cl.
CPC .... *C23C 16/45544* (2013.01); *C23C 16/4583* (2013.01); *C23C 16/52* (2013.01); *H01L 21/67017* (2013.01)

(58) Field of Classification Search
CPC ............................................. C23C 16/45525
See application file for complete search history.

(56) References Cited

U.S. PATENT DOCUMENTS

| | | |
|---|---|---|
| 4,389,973 A | 6/1983 | Suntola et al. |
| 5,879,459 A | 3/1999 | Gadgil et al. |
| 6,475,276 B1 | 11/2002 | Elers et al. |
| 6,528,430 B2 | 3/2003 | Kwan et al. |
| 6,585,823 B1 | 7/2003 | Van Wijck |
| 6,630,201 B2 | 10/2003 | Chiang et al. |
| 6,812,157 B1 | 11/2004 | Gadgil |
| 6,902,620 B1 | 6/2005 | Omstead et al. |
| 7,060,132 B2 | 6/2006 | Lindfors et al. |

(Continued)

FOREIGN PATENT DOCUMENTS

| | | |
|---|---|---|
| FI | 57975 | 7/1980 |
| WO | WO 03/062490 A2 | 7/2003 |
| WO | WO 2004/083485 A2 | 9/2004 |

OTHER PUBLICATIONS

Min, Jae-Sik et al., "Atomic layer deposition of TiN films by alternate supply of Tetrakis(ethylmethylamino)-Titanium and Ammonia," Jpn. J. Appl. Phys., 1998, vol. 37, pp. 4999-5004, Part 1, No. 9A, Sep. 1998.

(Continued)

*Primary Examiner* — Joseph A Miller, Jr.
(74) *Attorney, Agent, or Firm* — Knobbe, Martens, Olson & Bear LLP (57) ABSTRACT

A semiconductor processing device can include a reactor assembly comprising a reaction chamber sized to receive a substrate therein. An exhaust line can be in fluid communication with the reaction chamber, the exhaust line configured to transfer gas out of the reaction chamber. A valve can be disposed along the exhaust line to regulate the flow of the gas along the exhaust line. A control system can be configured to operate in an open loop control mode to control the operation of the valve.

16 Claims, 9 Drawing Sheets

| Gas Load | Valve Control Pressure | Valve Set Point (Position) | Wafer pressure | Wafer pressure / control pressure delta |
|---|---|---|---|---|
| slm | Torr | % | Torr | Torr |
| 0.283 | 1 | 13.8 | 1.104 | 0.104 |
| 1.315 | 1 | 18.8 | 1.374 | 0.374 |
| 2.570 | 1 | 23.4 | 1.676 | 0.676 |
| 3.006 | 1 | 25.1 | 1.777 | 0.777 |
| 3.451 | 1 | 26.8 | 1.879 | 0.879 |
| 3.915 | 1 | 29.1 | 1.98 | 0.98 |

(56) References Cited

U.S. PATENT DOCUMENTS

| | | | |
|---|---|---|---|
| 7,141,095 B2 | 11/2006 | Aitchison et al. | |
| 7,404,984 B2 | 7/2008 | Suntola et al. | |
| 7,846,499 B2 | 12/2010 | Blomberg | |
| 2002/0073924 A1* | 6/2002 | Chiang | C23C 16/0227 118/723 R |
| 2003/0013320 A1 | 1/2003 | Kim et al. | |
| 2003/0221780 A1 | 12/2003 | Lei et al. | |
| 2005/0016956 A1 | 1/2005 | Liu et al. | |
| 2005/0208217 A1* | 9/2005 | Shinriki | C23C 16/34 427/248.1 |
| 2007/0009658 A1* | 1/2007 | Yoo | C23C 16/14 427/248.1 |
| 2007/0195853 A1* | 8/2007 | Park | C23C 16/46 374/1 |
| 2015/0011095 A1* | 1/2015 | Chandrasekharan | C23C 16/45525 438/758 |
| 2017/0204518 A1* | 7/2017 | Yamasaki | C23C 16/4412 |
| 2018/0274615 A1* | 9/2018 | Fiala | C23C 16/045 |

OTHER PUBLICATIONS

Technology Backgrounder: Atomic Layer Deposition from ICKnowledge LLC, p. 1-7, 2004.

\* cited by examiner

| Gas Load | Valve Control Pressure | Valve Set Point (Position) | Wafer pressure | Wafer pressure / control pressure delta |
|---|---|---|---|---|
| slm | Torr | % | Torr | Torr |
| 0.283 | 1 | 13.8 | 1.104 | 0.104 |
| 1.315 | 1 | 18.8 | 1.374 | 0.374 |
| 2.570 | 1 | 23.4 | 1.676 | 0.676 |
| 3.006 | 1 | 25.1 | 1.777 | 0.777 |
| 3.451 | 1 | 26.8 | 1.879 | 0.879 |
| 3.915 | 1 | 29.1 | 1.98 | 0.98 |

SYSTEMS AND METHODS FOR CONTROLLING VAPOR PHASE PROCESSING

BACKGROUND

Field

The field relates to systems and methods for controlling vapor phase processes, and in particular to systems and methods for controlling vapor phase processes in which overall flow rates vary during processing.

Description of the Related Art

Atomic Layer Deposition (ALD) is a method for growing highly uniform thin films onto a substrate. In a time-divided ALD reactor, the substrate is placed into reaction space free of impurities and at least two different volatile precursors (reactant vapors) are injected in vapor phase alternately and repetitively into the reaction space. The film growth is based on self-limiting surface reactions that take place on the surface of the substrate to form a solid-state layer of atoms or molecules, because the reactants and the temperature of the substrate are chosen such that the alternately-injected vapor-phase precursor's molecules react only on the substrate with its surface layer. The reactants are injected in sufficiently high doses for the surface to be practically saturated during each injection cycle. Therefore, the process is highly self-regulating, being not very dependent on the concentration of the starting materials, temperature or duration of exposure (at least within relatively wide process windows) whereby it is possible to achieve extremely high film uniformity and a thickness accuracy of a single atomic or molecular layer. Similar results can be obtained in space-divided ALD reactors, where the substrate is moved into zones for alternate exposure to different reactants. Reactants can contribute to the growing film (precursors) and/or serve other functions, such as stripping ligands from an adsorbed species of a precursor to facilitate reaction or adsorption of subsequent reactants.

The ALD method can be used for growing both elemental and compound thin films. ALD can involve alternate two or more reactants repeated in cycles, and different cycles can have different numbers of reactants. Pure ALD reactions tend to produce less than a monolayer per cycle, although variants of ALD may deposit more than a monolayer per cycle.

Growing a film using the ALD method can be a slow process due to its step-wise (layer-by-layer) nature. At least two gas pulses are alternated to form one layer of the desired material, and the pulses are kept separated from each other for preventing uncontrolled growth of the film and contamination of the ALD reactor. After each pulse, the gaseous reaction products of the thin-film growth process as well as the excess reactants in vapor phase are removed from the reaction space, or the substrate is removed from the zone that contains them. In time-divided examples, this can be achieved by pumping down the reaction space, by purging the reaction space with an inactive gas flow between successive pulses, or both. Purging employs a column of an inactive gas in the conduits between the reactant pulses. Purging is widely employed on production scale because of its efficiency and its capability of forming an effective diffusion barrier between the successive pulses. Regularly, the inert purging gas is also used as a carrier gas during reactant pulses, diluting the reactant vapor before it is fed into the reaction space.

It can be challenging to control the transition from purging to dosing, and vice versa, while ensuring both high film quality and efficiency for in time and consumption of reactants. Accordingly, there remains a continuing need for improved systems and methods for controlling deposition processes.

SUMMARY

The systems and methods of the present disclosure have several features, no single one of which is solely responsible for its desirable attributes. Without limiting the scope of this disclosure as expressed by the claims which follow, various features will now be discussed briefly. After considering this discussion, and particularly after reading the section entitled "Detailed Description," one will understand how the features described herein provide several advantages over traditional gas delivery methods and systems.

In one embodiment, an atomic layer deposition (ALD) device is disclosed. The ALD device can comprise a reactor assembly comprising a reaction chamber sized to receive a substrate therein. The ALD device can comprise an exhaust line in fluid communication with the reaction chamber, the exhaust line configured to transfer gas out of the reaction chamber. The ALD device can comprise a valve disposed along the exhaust line to regulate the flow of the gas along the exhaust line, the valve having a plurality of flow conductance settings. The ALD device can comprise a control system configured to control the operation of the valve. During a dose state of the ALD device, the control system can be configured to send a first signal to the valve corresponding to a first flow conductance of the plurality of flow conductance settings. During a purge state of the ALD device, the control system can be configured to send a second signal to the valve corresponding to a second flow conductance of the plurality of flow conductance settings.

In another embodiment, a semiconductor processing device is disclosed. The semiconductor processing device can comprise a reactor assembly comprising a reaction chamber sized to receive a substrate therein. The semiconductor processing device can comprise an exhaust line in fluid communication with the reaction chamber, the exhaust line configured to transfer gas out of the reaction chamber. The semiconductor processing device can comprise a valve disposed along the exhaust line to regulate the flow of the gas along the exhaust line. The semiconductor processing device can comprise a control system configured to operate in an open loop control mode to control the operation of the valve.

In another embodiment, a method of controlling an atomic layer deposition (ALD) device is disclosed. The ALD device can comprise a reaction chamber, an exhaust line that transfers gas out of the reaction chamber, and a valve along the exhaust line. The method can comprise, for a dose state of the ALD device, determining a first flow conductance setting of the valve corresponding to a first flow conductance based at least in part on a first desired pressure in the reaction chamber and a first gas load for the dose state. The method can comprise, for a purge state of the ALD device, determining a second flow conductance setting of the valve corresponding to a second flow conductance based at least in part on a second desired pressure in the reaction chamber and a second gas load for the purge state. The method can comprise placing the valve at the first flow conductance setting for at least a portion of the dose state. The method can comprise pulsing a first reactant vapor into the reaction chamber during the dose state. The method can comprise placing the valve at the second flow conductance setting for at least a portion of the purge state. The method can comprise purging the reaction chamber by supplying an inactive gas to the reaction chamber during the purge state.

BRIEF DESCRIPTION OF THE DRAWINGS

These and other features, aspects and advantages of the present invention will now be described with reference to the drawings of several embodiments, which embodiments are intended to illustrate and not to limit the invention.

DETAILED DESCRIPTION

Various embodiments disclosed herein relate to systems and methods for controlling a deposition process in a semiconductor processing device. While embodiments are described in the context of deposition devices (e.g., an atomic layer deposition (ALD) device, a chemical vapor deposition (CVD) device, etc.), the skilled artisan will appreciate application for the principles and advantages taught herein for other types of processing in which overall flow rates and/or pressure may change frequently during processing.

Figure 1A:
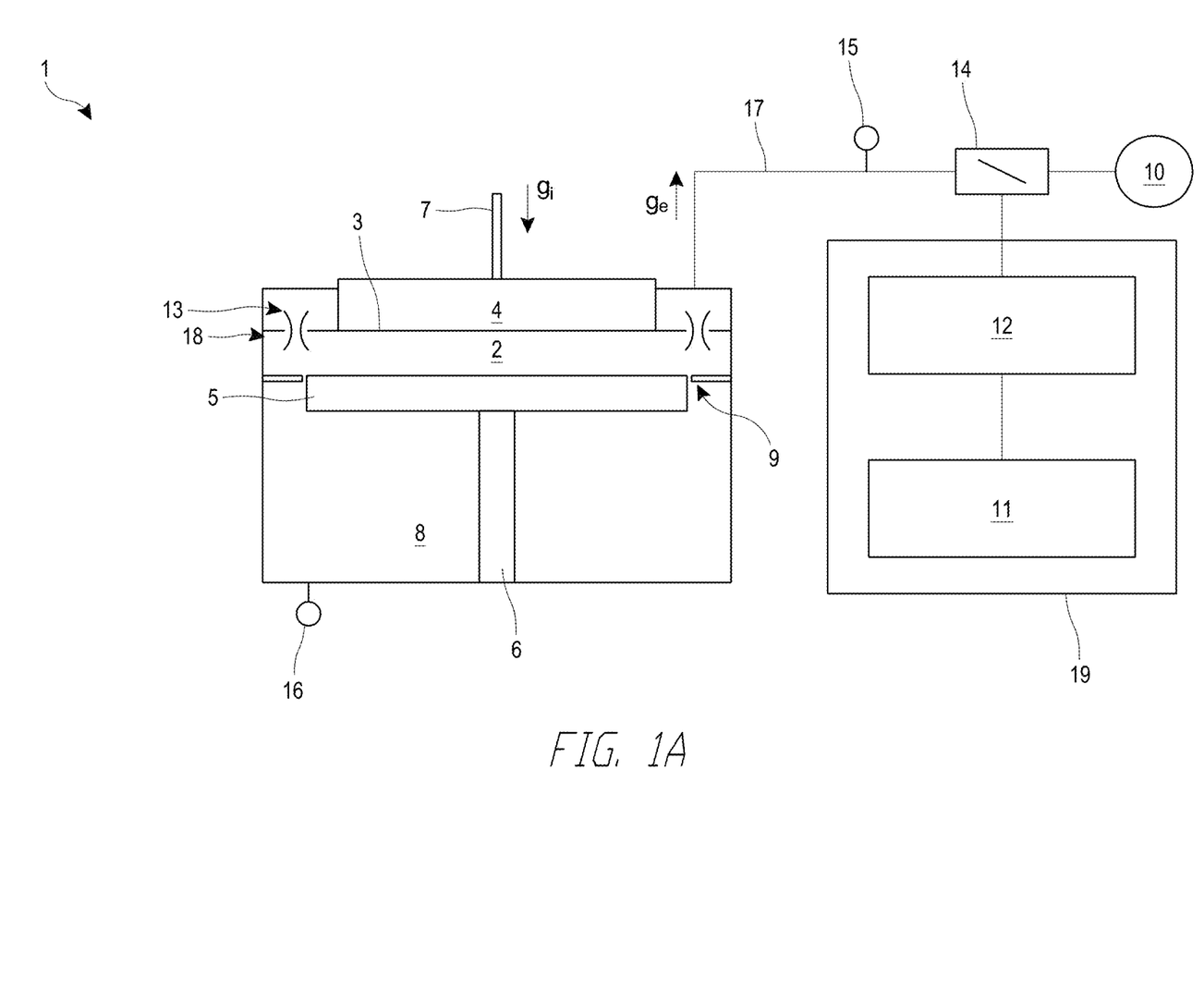
FIG. 1A is a schematic side sectional view of a semiconductor processing device comprising a reactor assembly, shown during a processing stage.
Figure 1B:
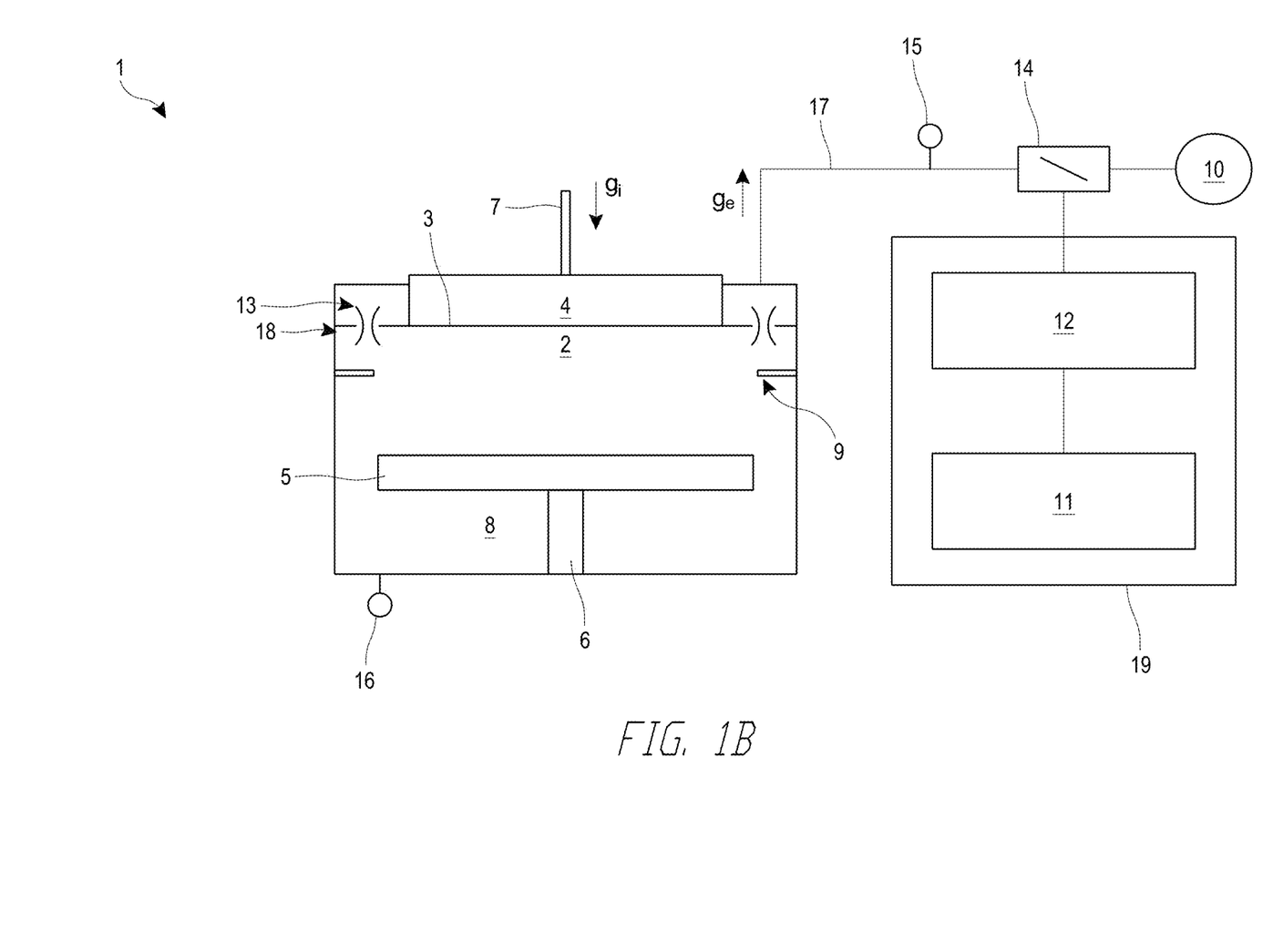
FIG. 1B is a schematic side sectional view of the semiconductor processing device of FIG. 1A, shown during a load/unload stage.

FIG. 1A is a schematic side sectional view of a semiconductor processing device 1 comprising a reactor assembly 18, shown during a processing stage of the device 1. FIG. 1B is a schematic side sectional view of the semiconductor processing device 1 of FIG. 1A, shown during a loading stage of the device 1. The embodiment shown in FIGS. 1A-1B illustrates an ALD device, but it should be appreciated that the embodiments disclosed herein can be utilized in conjunction with any suitable type of semiconductor processing device (e.g., any suitable type of deposition device). Furthermore, the semiconductor processing devices, control systems, and methods may be used in conjunction with the processing systems described throughout U.S. Pat. Nos. 8,211,230; 8,216,380; U.S. patent application Ser. No. 15/803,615, filed Nov. 3, 2017; U.S. patent application Ser. No. 15/785,231, filed Oct. 16, 2017; and U.S. Pat. No. 9,574,268, the entire contents of each of which are hereby incorporated by reference in their entirety and for all purposes.

The reactor assembly 18 can comprise an upper reaction chamber 2 disposed above a lower loading chamber 8. The reaction chamber 2 can be sized to receive a substrate (e.g., a semiconductor wafer) for processing. To load the reactor assembly 18, as shown in FIG. 1B, a susceptor 5 supported by a movable arm 6 can be lowered such that the susceptor 5 is disposed in the loading chamber 8. In embodiments, the susceptor 5 can include an internal heating mechanism, such as a resistive heater. A substrate (such as a wafer), not shown, can be positioned on the susceptor 5. The movable arm 6 can be raised vertically to position the substrate (not shown) within the reaction chamber 2. For example, the movable arm 6 can be raised such that an upper surface of the susceptor 5 is exposed to the reaction chamber 2. A partition 9 can separate the reaction chamber 2 and the loading chamber 8. In embodiments, there may be some limited fluid communication between the loading chamber 8 and the reaction chamber 2 in the process position (FIG. 1A), such as through the illustrated small gap or series of openings between the susceptor 5 and the partition 9. As shown in FIGS. 1A and 1B, a lower chamber (LC) pressure transducer 16 can be provided in the loading chamber 8 to measure the pressure in the loading chamber 8. In the illustrated embodiment, no pressure measurement device is present in the reaction chamber 2 in order to avoid undesirable effects upon gas flow in the reaction chamber 2.

During a deposition process, such as an ALD process, influent gases $g_i$ (e.g., reactant and/or inactive gases) can alternately and repeatedly be supplied to the reactor assembly 18 by way of an inlet manifold 7. For example, during a pulse or dose state of an ALD process, a reactant gas can be supplied to the reactor assembly 18 by way of the inlet manifold 7. The reactant gas can react with a target species on the substrate to form a monolayer of the desired reactant. During a purge state, an inactive gas can be supplied to the reactor assembly 18 by way of the inlet manifold 7, to purge excess reactant (and other) gases from the reaction chamber 2. The dosing and purging steps can be alternately repeated to grow the film a layer at a time until the layer reaches the overall desired thickness. The influent gases $g_i$ can be dispersed over the substrate in FIG. 1A by way of a showerhead assembly comprising a showerhead plate 3 and a showerhead plenum 4 disposed above the showerhead plate 3. The showerhead plate 3 can comprise a plurality of openings (not shown) which can evenly and uniformly disperse the influent gases $g_i$ over the substrate. Although a showerhead assembly is shown in FIGS. 1A-1B, it should be appreciated that other types of reactors can be used in conjunction with the disclosed embodiments, such as horizontal flow reactors.

The reactant and/or inactive gases in the reaction chamber 2 can be removed from the reactor assembly 18 by a vacuum source 10 (e.g., a vacuum pump) along an exhaust line 17. The vacuum source 10 can be activated to apply a negative pressure to the exhaust line 17 and to the reaction chamber 2 to draw exhaust gases $g_e$ from reactor assembly 18. As shown in FIG. 1A, the gases can exit the reaction chamber 2 by way of one or a plurality of exhaust port(s) 13 that provide fluid communication between the reaction chamber 2 and the exhaust line 17. In the illustrated embodiment, the exhaust port(s) 13 feed an exhaust ring that communicates with the exhaust line 17. A valve 14 (e.g., a flow control valve) can be adjustably opened and closed at a plurality of set points or positions to meter the flow of exhaust gases $g_e$ along the exhaust line 17. The plurality of set points or positions can correspond to a plurality of corresponding flow conductances of the valve 14. The valve 14 shown in FIGS. 1A-1B comprises a throttle valve that can be opened at a plurality of positions to increase or decrease the flow of exhaust gases $g_e$ through the exhaust line 17. For example, the valve 14 can be positioned to be between 0% and 100% open, with 0% representing fully closed and 100% representing fully open, and any of a variety of positions therebetween. In other embodiments, as explained below in connection with FIGS. 6A-6B, the valve 14 can comprise a ball valve configured to control the flow of exhaust gases $g_e$ through the exhaust line 17. As shown in FIGS. 1A-1B, an exhaust line pressure transducer 15 can be provided along the exhaust line 17 to measure the pressure of exhaust gases $g_e$ along the exhaust line 17.

As explained herein, a control system 19 can be configured to control the operation of the semiconductor processing device 1. The control system 19 can comprise a module controller 11 and a valve controller 12. Although not shown, the control system 19 can comprise additional controllers for controlling the overall operation of the device 1. The module controller 11 can be configured to select (automatically or manually) the processing control modes, processing types, recipes used, and other parameters for a particular process. The module controller 11 can communicate with the valve controller 12, which is configured to control the operation of the valve 14. For example, as explained below, the module controller 11 can send instructions to the valve controller 12 regarding the stage or state of the process (e.g., dose or purge), a control mode operation of the device 1 (e.g., whether the device 1 is to be operated in open or closed loop control mode), a control pressure set point (e.g., for closed loop control), and a plurality of valve position set points (e.g., fixed control positions of the valve 14). Furthermore, as explained below and based on instructions from the module controller 11, the valve controller 12 can send instructions to the valve 14 to place the valve at one of a plurality of set points corresponding to a plurality of flow conductances of the valve 14. Such instructions may be based, for example, on a look-up table with a plurality of flow conductances or conductance ranges and a corresponding plurality of valve positions. The module controller 11 and the valve controller 12 can comprise any suitable processing electronics for controlling the operation of the valve 14 and/or other components of the processing device 1. For example, the module controller 11 and/or the valve controller 12 can comprise associated non-transitory computer-readable memory device(s) and processor(s) configured to execute instructions stored on the associated memory device(s). In various embodiments, for example, the valve controller 12 can comprise a programmable logic controller (PLC). Any other suitable types of controllers or processing electronics can be used.

It can be desirable for overall flow rates and corresponding conductance through the reaction chamber 2 and the exhaust line 17 to vary in a multi-stage process, such as an atomic layer deposition (ALD) process. For example, during a purging state, to maximize throughput and reduce reactant/byproduct residence time, it can be desirable to use high flow rates (gas loads) in order to rapidly purge excess or waste gases from the reaction chamber 2. During a depositing stage, such as an ALD dosing state, however, it can be desirable to utilize a longer reactant residence time at lower flow rates (gas loads) in order to achieve saturation (or near-saturation) with minimal waste of reactants. Many ALD processes seek to maintain a relatively constant overall flow rate and/or uniform pressure in the reaction chamber 2 during dosing and purging in order to avoid pressure fluctuations and attendant contamination issues (e.g., spalling). Accordingly, many ALD recipes use a constant overall gas load or flow rate. However, the use of a constant gas load may sacrifice purge efficiency and/or the quality of the film deposition.

In some arrangements, the pressure within the reaction chamber 2 can be controlled using a closed loop control mode. For example, in some arrangements, the exhaust line pressure transducer 15 can be used to measure the pressure of the exhaust gases $g_e$ along the exhaust line 17. The measured pressure along the exhaust line 17 can be fed back to the control system 19. Various control algorithms (e.g., a proportional-integral-derivative, or PID, control algorithm) can be used to adjust the set points of the valve 14 to control the pressure measured by the transducer 15. However, basing the closed loop feedback control on pressure measurements taken by the exhaust line pressure transducer 15 along the exhaust line 17 may be inaccurate and may not accurately reflect the pressure (or changes in pressure) of gases within the reaction chamber 2, resulting in inaccurate or sub-optimal control of the pressure in the reaction chamber 2. Similarly, the pressure in the loading chamber 8 may not accurately reflect the pressure in the reaction chamber 2, due to the different flow rates and limited fluid communication between the chambers during processing, and as noted above pressure measurement devices in the reaction chamber can interfere with desired flow dynamics by creating dead legs or turbulence.

For example, the exhaust ports 13 may act as a restriction on the outflow of gases from the reaction chamber 2 to the exhaust line 17. The constriction of the exhaust ports 13 may result in pressure readings by the exhaust line pressure transducer 15 that are different from (e.g., lower than) the actual pressure within the reaction chamber 2. In addition, as shown in FIGS. 1A-1B, the exhaust line pressure transducer 15 may be spaced away from the reaction chamber 2 by an intervening flow volume, e.g., by way of the exhaust portions 13 (and any intervening exhaust plenum) and the volume of the exhaust line 17 upstream of the transducer 15. This additional volume upstream of the transducer 15 in the space between the transducer 15 and the reaction chamber 2 may slow the response of the closed loop control methods. Furthermore, closed loop feedback control of the valve 14 in high-speed ALD processes may not be suitable, because the gas loads may change every 200-500 milliseconds. Some throttle valves may not be capable of switching at such high speeds, and/or such rapid switching may damage the valves. Moreover, placing a pressure transducer within the reaction chamber 2 itself may not be desirable, since the presence of the pressure transducer 15 in such a small space may interfere with the flow patterns over the wafer and may negatively affect film growth.

Accordingly, there remains a continuing need for improved methods of controlling the pressure in the reaction chamber 2. Various embodiments disclosed herein utilize open loop control (e.g., fixed position control of the valve 14) to indirectly control the pressure within the reaction chamber 2 during dosing states and purging states. For example, in some embodiments, the LC transducer 16 can be used to measure the pressure in the loading chamber 8 at various gas loads (flow rates) applied by the vacuum pump 10, and the measured pressure in the loading chamber 8 can be correlated with corresponding set points or set positions of the valve (representative of corresponding fluid conductances of the valve). In various embodiments, a flow controller (e.g., a pressure controller or a master flow controller, or MFC) can be provided upstream of the reaction chamber 2 to adjust and/or provide the desired gas load. As explained herein, the valve 14 can act as a restriction on the flow through the exhaust line 17, which can change the pressure in the chamber 2 (see, e.g., FIG. 3). In the embodiments disclosed herein, the vacuum pump 10 can be activated at a constant speed, unless otherwise noted. In other embodiments, however, the speed of the vacuum pump 10 can vary during a procedure.

During a processing stage in which a substrate is undergoing a deposition process (FIG. 1A), the LC transducer 16 disposed in the loading chamber 8 may not accurately represent the pressure within the upper reaction chamber 2. For example, the reaction chamber 2 and loading chambers 8 may be isolated during processing so as to prevent gases from flowing from the reaction chamber 2 into the loading chamber 8. As shown in FIG. 1A, the partition 9 and the susceptor 5 may be spaced close together laterally by a small gap or by multiple openings in the space between the partition 9 and the susceptor 5. In some arrangements, the pressure in the loading chamber 8 may be set at a higher pressure than the reaction chamber 2, which in combination with the close spacing of the partition 9 and susceptor 5, may prevent gases from flowing into the loading chamber 8. Preventing gases from entering the loading chamber 8 can be beneficial in reducing contamination of the loading chamber 8 and the LC transducer 16 during transfer of wafers to and/or from the loading chamber 8, although other arrangements for minimizing contamination are also compatible with the embodiments taught herein.

To calibrate the device 1 for open loop control, the movable arm 6 and susceptor 5 may be moved vertically downward such that the susceptor 5 is in the loading chamber 5, which breaks the fluid seal between the reaction and loading chambers 2, 8, such that the reaction and loading chambers 2, 8 define a continuous volume or chamber. Therefore, when the susceptor 5 is in the position shown in FIG. 1B, the LC transducer 16 can represent the pressure in the reaction chamber 2, which in the position shown in FIG. 1B, is in open and fluid communication with the loading chamber 8. The pressure in the reaction chamber 2 can be measured by the LC transducer 16 for a plurality of set points or positions of the valve 14, across a plurality of gas loads (flow rates). The measured reaction chamber pressures, valve set points, and gas loads can be stored in a look up table (LUT) and/or plotted in a graph to provide input data to the control system 19. In other embodiments, pressures in the reaction chamber can be directly measured with the susceptor in the process position for purposes of calibration, such as with temporary or permanent instrumentation for direct pressure measurements in the reaction chamber.

Figure 2:
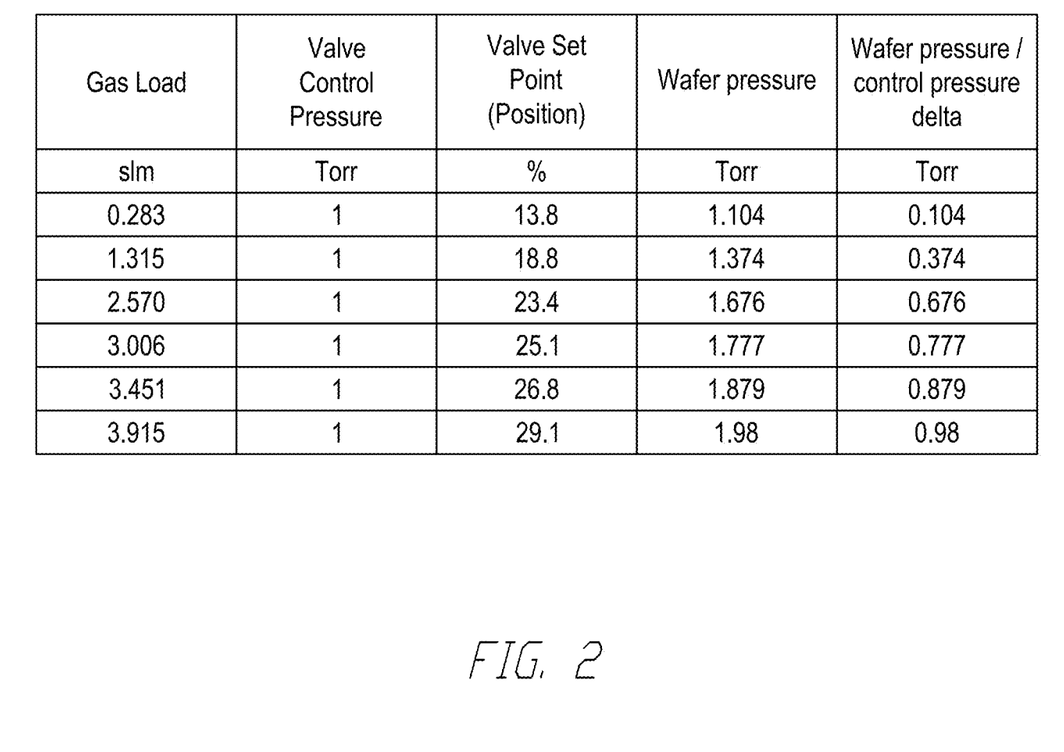
FIG. 2 is a table of representative values of gas load (flow rate), valve control pressure, valve set point or position, measured pressure in the reaction chamber, and the difference between measured wafer pressure and control pressure for the semiconductor processing device shown in FIGS. 1A-1B.

FIG. 2 is a table of representative values of gas load (flow rate), valve control pressure, valve set point or position, measured wafer pressure (i.e., pressure in the reaction chamber 2), and the difference between measured wafer pressure and control pressure. The table shown in FIG. 2 is representative of values obtained for a closed loop control system. As shown in FIG. 2, when the valve 14 is set at a control pressure of 1 Torr, the pressure in the reaction chamber 2 can vary by over 800 mTorr as gas loads are increased by at least a factor of 10. This variance in gas load can cause a large variation in the reaction chamber 2 during a closed loop control mode. As shown in FIG. 2, the valve set point is typically more open with higher gas loads (e.g., a purging load at higher flow rates) to match the wafer pressure under a low gas load (e.g. dosing load at lower flow rates). As shown in FIG. 2, it can be important to improve the control of the variation in pressures for changing gas loads.

Figure 3:
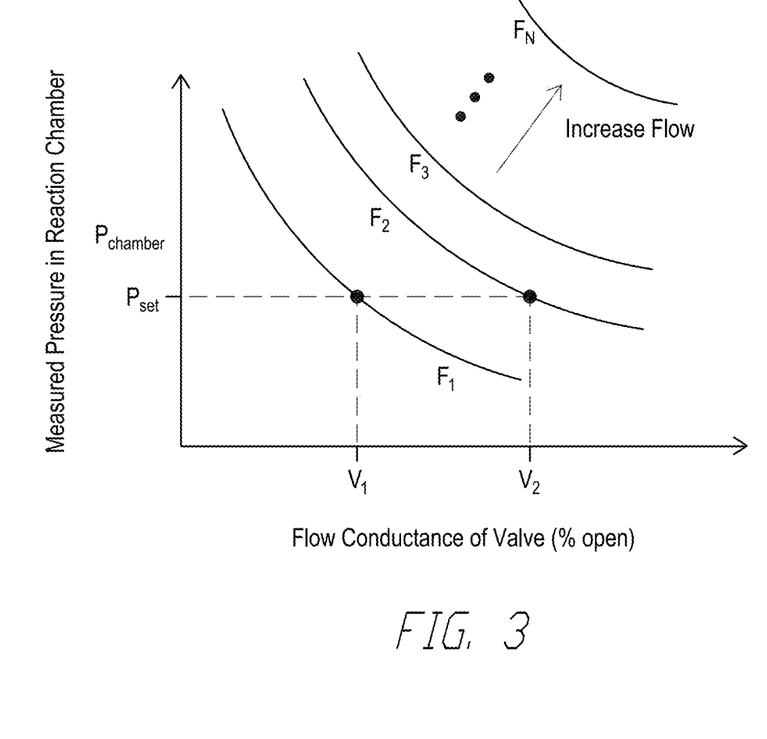
FIG. 3 is an example of a graph that plots measured reaction chamber pressures versus set points of a valve along an exhaust line of the semiconductor processing device, plotted across a plurality of gas loads.

FIG. 3 is an example of a graph that plots measured reaction chamber pressures versus the set points of the valve 14, across a plurality of gas loads. The graph shown in FIG. 3 is schematic, but can be considered representative of data provided in a LUT. As explained above, the graph of FIG. 3 (and corresponding LUT) can be generated by measuring (directly or indirectly) the pressure in the reaction chamber 2 for a plurality of set points or positions of the valve 14 at a first particular gas load or flow rate $F_1$. The gas load or flow rate $F_1$ can be increased to a second gas load or flow rate $F_2$, and the pressure in the reaction chamber 2 can be measured for the plurality of set points of the valve 14 at the second flow rate $F_2$. The calibration can continue until the pressures and valve positions for all desired flow rates $F_N$ have been determined. Thus, the LUT can comprise a matrix including calibrated values for pressure vs. valve set point (related to valve flow conductance) vs. gas load applied to the device 1 (e.g., by a controller (such as a MFC or pressure controller) provided upstream of the chamber). The overall gas load or flow rate F can represent the total flow rate into the reaction chamber 2. In other embodiments, an analytical function or curve-fit can be determined to relate reaction chamber set pressure, valve settings (conductances of the valve 14), and gas load (flow rate) provided by the pump 5. As shown in FIG. 3, for a particular flow rate, the pressure in the chamber may decrease with increasing flow conductance of the valve (e.g. as related to how open the valve is).

Thus, during an ALD process, the control system 19 (or the user) can select a desired set pressure $P_{set}$ for the reaction chamber 2 for both dose and purge states, given the gas loads provided by a recipe for those dose and purge states. For example, if the first lower flow rate $F_1$ is to be used during the dosing state (per the process recipe, with a controller controlling the flow rate $F_1$), the control system 19 (or the user) can determine first conductance settings of the valve 14, for example, a first set position $V_1$ (Position 1) of the valve 14 along the curve for the first flow rate $F_1$ that yields a pressure in the reaction chamber 2 of approximately $P_{set}$. The control system 19 can instruct the valve 14 to move to the first set position $V_1$ during dosing. After the dosing is complete, the control system 19 can turn off the flow of reactant gas. If the second higher flow rate $F_2$ is to be used during the purging state (per the recipe, with the controller controlling the flow rate $F_2$), the control system 19 (or the user) can determine second conductance settings for the valve, for example, a second set position $V_2$ (Position 2) of the valve 14 along the curve for the second flow rate $F_2$ that yields a pressure in the reaction chamber 2 of approximately $P_{set}$. The control system 19 can instruct the valve 14 to move to the second set position $V_2$ during purging. Although the example above describes one valve (or conductance) setting per state (dose or puge), it should be appreciated that in various embodiments, multiple valve or conductance settings can be used per state (dose or purge).

The example described above and illustrated in FIG. 3 assumes a desire to maintain the pressure of the reaction chamber 2 at an approximately constant pressure during both purging and dosing to minimize pressure fluctuations and attendant contamination issues. Of course, the open loop control described herein can also be employed with different pressure set points at different stages of a process if desired. Further, although only one purge and one dose step are described in this example ALD process, it should be appreciated that a particular cycle of a deposition process can comprise more than one dose step and/or more than one purge step. For example, some deposition processes (e.g., ALD processes) can comprise a cycle with four phases including, e.g., two different reactant vapors (which may utilize different valve conductances and durations) and two different purges (which may or may not have the same valve conductances and durations). Furthermore, some deposition processes (e.g., ALD processes) may comprise a cycle that pulses three different reactant vapors with one, two, or three purge phases in each cycle. Other deposition processes (e.g., ALD processes) may comprise a cycle that pulses four different reactant vapors with one, two, three, or four purge phases in each cycle.

Beneficially, the LUT described herein and the graph shown in FIG. 3 can enable the use of open loop, or fixed position, control in which no active feedback is provided to the control system 19 by the exhaust line pressure transducer 15 (or other sensors) before switching valve positions. Thus, when the device 1 is placed in a purging state, the valve 14 can be set to a valve position or set position based on the desired pressure at the purging flow rate. Similarly, when the device 1 is placed in a dosing state, the valve 14 can be set to a valve position or set position based on the desired pressure at the purging flow rate. The open loop control methods described herein can be superior to closed loop control, since the valve set positions correspond more accurately to the pressure in the reaction chamber 2 at various flow rates, as opposed to pressure measurements taken in real time along the exhaust line 17 by the transducer 15. Furthermore, the techniques disclosed herein can obviate the need for a pressure transducer 15 exposed to exhaust gases $g_e$, in favor of using the LC transducer 16 that is isolated from gases of the reaction chamber 2 that may damage the transducer. Accordingly, the open loop control methods disclosed herein may improve the control of pressure in the reaction chamber 2 during vapor phase processing, particularly for processes with different desired overall flow rates at different stages, and even more particularly for processes with rapid switches between phases. In various ALD processes for example, the dosing stage can last for a period of time between about 50 msec and 5 sec.

In addition, various embodiments disclosed herein address additional drawbacks of closed loop pressure control systems related to digital output of control signals. The set point or position of the valve 14 shown in FIGS. 1A-1B (e.g., a throttle valve) can be adjusted by controlling the position of a plate or other structural member of the valve 14 to adjustably limit flow through the valve 14 and exhaust line 17. However, many closed loop control systems utilize digital outputs, which can make it challenging to precisely set the position of the valve 14 at the desired analog set point calculated by the closed loop control system. For example, in a closed loop control system, the control system may calculate an analog set point for the valve 14 that does not closely correlate to a digital output of the control system.

Figure 4:
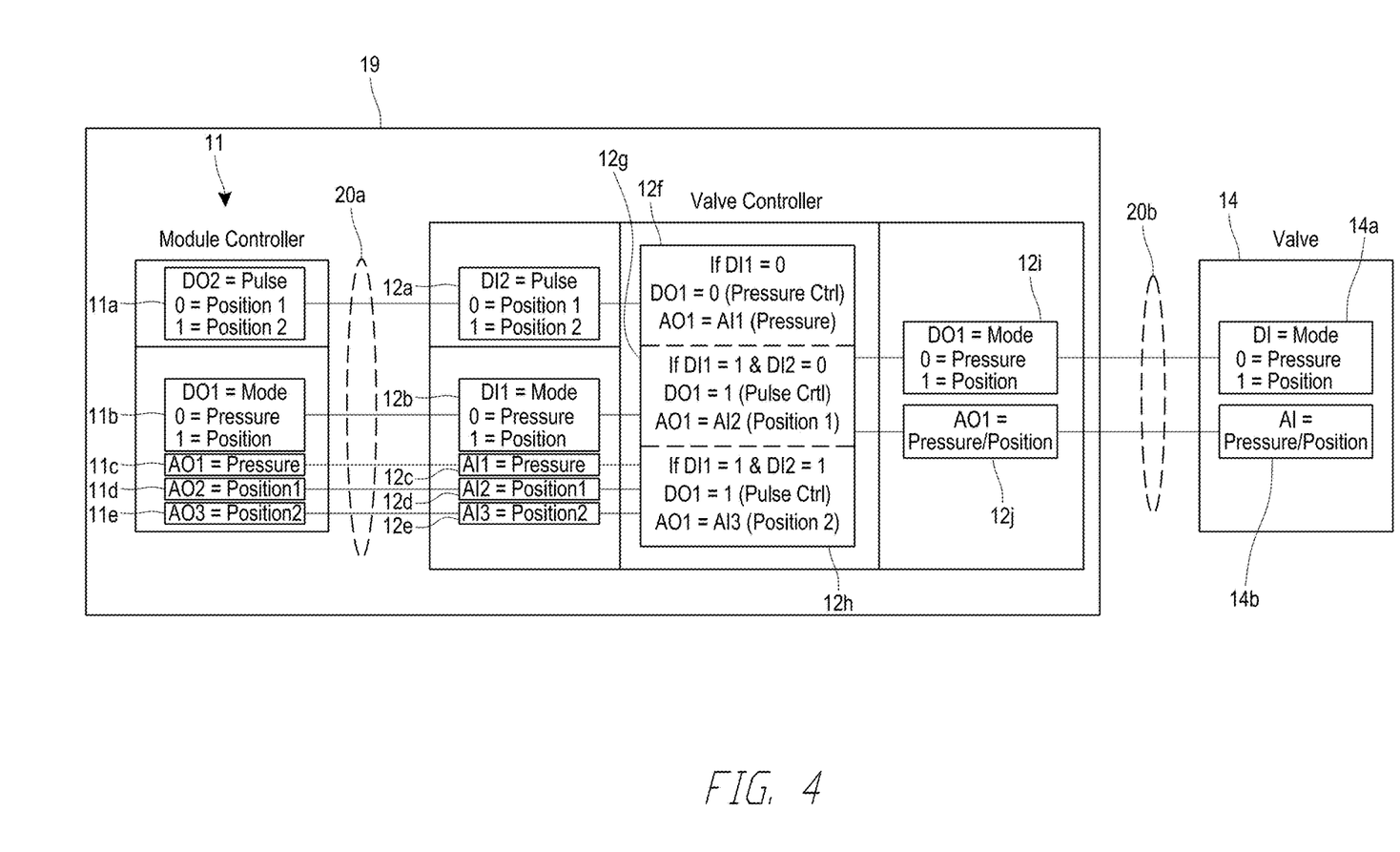
FIG. 4 is a schematic system diagram of a control system in electrical communication with the valve.

FIG. 4 is a schematic system diagram of the control system 19 in electrical communication with the valve 14. As explained above in connection with FIGS. 1A-1B, the module controller 11 can be configured to control the operation of the valve controller 12, which in turn can be configured to control the operation of the valve 14. In FIG. 4, the module controller 11 can comprise output signal blocks 11a-11e, each of which comprise digital or analog output values that are to be transmitted to the valve controller 12 by way of a first communications channel 20a. The first communications channel 20a can comprise any suitable wired or wireless electrical or data connection between the module controller 11 and the valve controller 12.

For example, in a first output signal block 11a of the module controller 11, for an ALD process, a digital output DO2 can be provided to instruct whether the semiconductor processing device 1 is to be placed in a dosing process of supplying reactant gas to the chamber 2 or in a purging process of removing excess gases from the chamber 2. For example, if the module controller 11 determines that the device 1 is to be placed in a dosing state, then the DO2 signal can be set to 0 to indicate a dosing state with a low flow conductance that corresponds to Position 1 (e.g., $V_1$ of FIG. 3) of the valve 14. By contrast, if the module controller 11 determines that the device 1 is to be placed in a purging state then the DO2 signal can be set to 1 to indicate a purging state with a high flow conductance that corresponds to Position 2 (e.g., $V_2$ of FIG. 3) of the valve 14. It should be appreciated throughout the description of FIG. 4, that the signals could instead be set to 0 for the purge state and to 1 for the dose state. Thus, digital output DO2 of block 11a can instruct the valve controller 12 whether the device 1 is to be placed in a dose state or purge state.

In a second output block 11b of the module controller 11, the digital output DO1 can comprise instructions regarding the mode of control of the process, e.g., whether the device 1 is to operate in closed loop feedback control (DO1=0) in which a pressure set point control will be provided, or to operate with open loop (fixed position) control (DO1=1), in which valve positions are changed without realtime feedback. Static analog variables AO1-AO3 may be defined by a recipe step before processing, e.g., AO1-AO3 may be set by the control system 19 or manually by the user (e.g., by way of a user interface). In a third block 11c, analog output AO1 may represent the closed loop control pressure set point, which represents the desired set point pressure if closed loop control is selected. In a fourth block 11d, analog output AO2 may represent Position 1 of the valve 14, for example, position $V_1$ shown in FIG. 3. As explained above, Position 1 may represent a low flow conductance state to be used during pulsing of the reactant gas to the reaction chamber 2. In a fifth block 11e, analog output AO3 may represent Position 2 of the valve 14, for example, position $V_2$ shown in FIG. 3. As explained above, Position 2 may represent a high flow conductance state to be used during purging of excess gases in the reaction chamber 2. The digital and analog outputs from blocks 11a-11e may be transmitted to the valve controller 12 by way of the first communications channel 20a.

Turning to the valve controller 12, the instructions sent by the module controller 11 may be received by analog or digital input blocks 12a-12e. In a first block 12a, digital input DI2 can correspond to digital output DO2 from the module controller 11. Since the dosing and purging steps are alternated rapidly, the output and input blocks 11a, 12a can be provided over a relatively high speed communications channel. In second through fifth input blocks 12b-12e, DI1 can represent the digital mode selection sent from block 11b of the module controller 11; AI1 can represent the analog pressure set control point sent from block 11c of the module controller 11; AI2 can represent Position 1 of the valve 14 sent from block 11d of the module controller 11; and AI3 can represent Position 2 of the valve 14 sent from block 11e of the module controller 11. Since the values in blocks 11b-11e and 12b-12e may be used for an entire process (or multiple processes), a slower communications network can be used.

The valve controller 12 can also include a plurality of logic blocks 12f, 12g, and 12h. Processing electronics can execute the instructions stored on memory device(s) of the valve controller 12 to determine, inter alia, control mode of the device, process state (e.g., purge or dose), valve set position, pressure set point for closed loop control, etc. For example, in a first logic block 12f, if DI1=0 (indicating closed loop control with pressure set point), then digital output DO1 of the valve controller 12 (see block 12i) can likewise be set to 0 to indicate closed loop control, and analog output AO1 of the valve controller 12 (see block 12j) can be set to the pressure control set point stored in AI1. In such an arrangement, the valve controller 12 can transmit DO1 and AO1 to blocks 14a, 14b of the valve 14, respectively, over a second communications channel 20b. With digital input DI=0 at the valve 14, therefore, the valve 14 can operate in a closed loop feedback mode. With analog input AI equal to the pressure set control point at the valve 14, the device 14 can use the pressure set control point to drive the closed loop feedback of the deposition process.

Alternatively, in a second logic block 12g of the valve controller 12, if DI1=1 (indicating open loop control with a position set point) and if DI2=0 (indicating that the valve should be located at Position 1), then digital output DO1 of block 12i is set to 1 and analog output AO1 of block 12j is set to AI2 to represent Position 1 of the valve 14 (e.g., $V_1$). Upon transmitting DO1 and AO1 of the valve controller 12 to respective blocks 14a, 14b of the valve 14 over the second communications channel 20b, digital input DI=1 at the valve 14, placing the valve 14 in an open loop control mode (e.g., no feedback). With analog input AI equal to Position 1, the valve 14 can move to Position 1 ($V_1$) which is representative of a low flow conductance reactant pulse state, as shown in FIG. 3.

Similarly, in a third logic block 12h of the valve controller 12, if DI1=1 (indicating open loop control with a position set point) and if DI2=1 (indicating that the valve should be located at Position 2), then digital output DO1 of block 12i is set to 1 and analog output AO1 of block 12j is set to AI3 to represent Position 2 of the valve 14 (e.g., $V_2$). Upon transmitting DO1 and AO1 of the valve controller 12 to respective blocks 14a, 14b of the valve 14 over the second communications channel 20b, digital input DI=1 at the valve 14, placing the valve 14 in an open loop control mode (e.g., no feedback). With analog input AI equal to Position 2, the valve 14 can move to Position 2 ($V_2$) which is representative of a high flow conductance purge state, as shown in FIG. 3.

Beneficially, therefore, the embodiments disclosed herein can utilize digital control systems to actuate a valve 14 having a continuous range of valve positions. The embodiments disclosed herein can select whether to operate in closed loop control mode, or in an open loop control mode.

Figure 5:
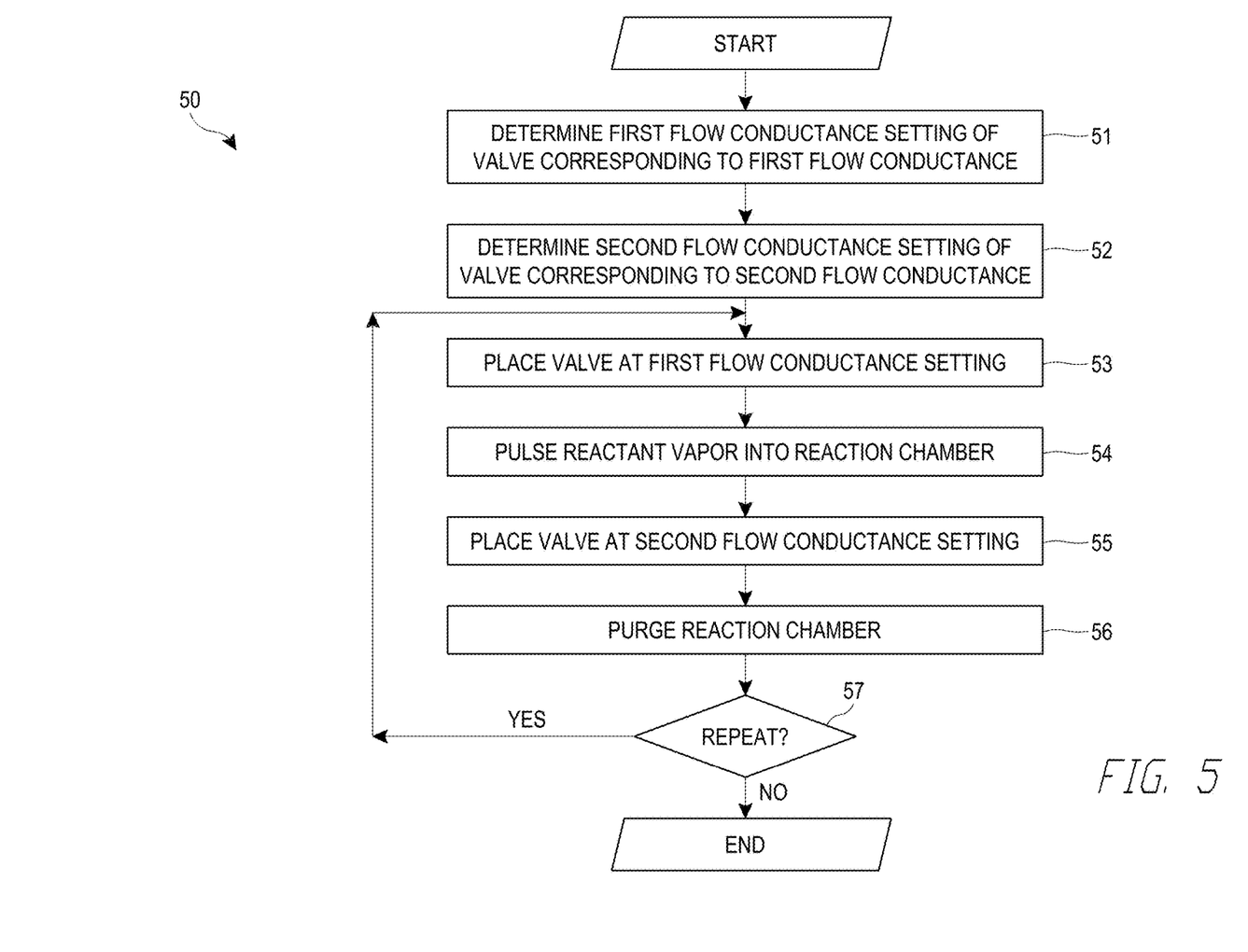
FIG. 5 is a flowchart illustrating a method for operating an ALD device, according to various embodiments.

FIG. 5 is a flowchart illustrating a method 50 for operating an ALD device, according to various embodiments. In particular, the method 50 illustrates various steps for controlling the pressure within the reaction chamber 2 using open loop control methods. Beginning in a block 51, a first conductance setting of the valve corresponding to a first flow conductance can be determined. For example, for the embodiment of FIGS. 1A-1B and 3-4, a first pre-programmed set point of the valve 14 along the exhaust line 17 is determined. The first pre-programmed set point can be representative of a position of a movable member in the valve 14 indicative of how open the valve 14 is (e.g., 0% to 100% open). The first pre-programmed set point can correspond to a first flow conductance setting of the valve 14 based at least in part on a first desired pressure in the reaction chamber 2 and on a first gas load to be applied to the exhaust line 17. As explained above, a LUT (or graph representative of a LUT) can be used to determine the first pre-programmed set point or set position of the valve 14 based on a desired pressure and on the gas load (flow rate) being applied to the device, e.g., by way of a controller upstream of the reaction chamber 2. In other arrangements, an empirically designed function or curve-fit (e.g., based on curves similar to FIG. 3) can be used to relate the desired pressure in the reaction chamber 2, the first flow conductance setting of the valve 14, and the gas load. For example, the first pre-programmed set point can correspond to a relatively low flow conductance to be used during the pulsing of reactant gas into the reaction chamber 2. Returning to the example shown in FIG. 3, the first pre-programmed set point of the valve can be determined to correspond to Position 1 (or $V_1$). As explained above, the LUT can be created by measuring the pressure of the reaction chamber 2 and loading chamber 8 using the LC transducer 16 when the susceptor 5 is disposed within the loading chamber 8 below the reaction chamber 2. Alternatively, pressure may be directly measured in the reaction chamber 2 for calibration, e.g., using temporary or permanent instrumentation for this purpose.

Turning to a block 52, a second conductance setting of the valve corresponding to a second flow conductance can be determined. For example, a second pre-programmed set point of the valve 14 along the exhaust line 17 can be determined. The second pre-programmed set point can correspond to the second flow conductance of the valve 14 based at least in part on a second desired pressure in the reaction chamber 2 and a second gas load. In some embodiments, as explained above, the second desired pressure can be approximately the same as the first desired pressure, so as to maintain a generally constant pressure in the reaction chamber 2 during dosing and purging steps. As explained above, the LUT (or graph representative of a LUT) can be used to determine the second pre-programmed set point or set position of the valve 14 based on the second desired pressure and on the applied gas load (flow rate). For example, the second pre-programmed set point can correspond to a relatively high flow conductance to be used during the purging of excess or waste gas from the reaction chamber 2. Returning to the example shown in FIG. 3, the second pre-programmed set point of the valve can be determined to correspond to Position 2 (or $V_2$).

In a block 53, the module controller 11 can instruct the valve controller 12 to place the valve 14 in the dosing state, e.g., at the first conductance setting. For dosing, the valve controller 12 can instruct the valve 14 to move to Position 1 ($V_1$) to provide a relatively low flow conductance during dosing. In a block 54, the control system 19 can cause the semiconductor processing device 1 to pulse reactant gas into the reaction chamber 2 to grow a layer of reactant on the substrate. After dosing, in a block 55, the module controller 11 can instruct the valve controller 12 to place the valve 14 at the second flow conductance state, e.g, at a valve setting for the purging state. For purging, the valve controller 12 can instruct the valve 14 to move to Position 2 ($V_2$) to provide a relatively high flow conductance during purging. In a block 56, the control system 19 can cause the semiconductor processing device 1 to purge excess or waste gas from the reaction chamber 2. Moving to a block 57, the control system 19 can determine whether the process is to be repeated. If the determination is yes, then the method 50 returns to the block 53 to place the valve 14 at the first flow conductance setting, e.g., the pre-programmed set point (Position 1) for pulsing additional reactant gas into the chamber 2. If the determination is no, then the method 50 ends.

Figure 6A:
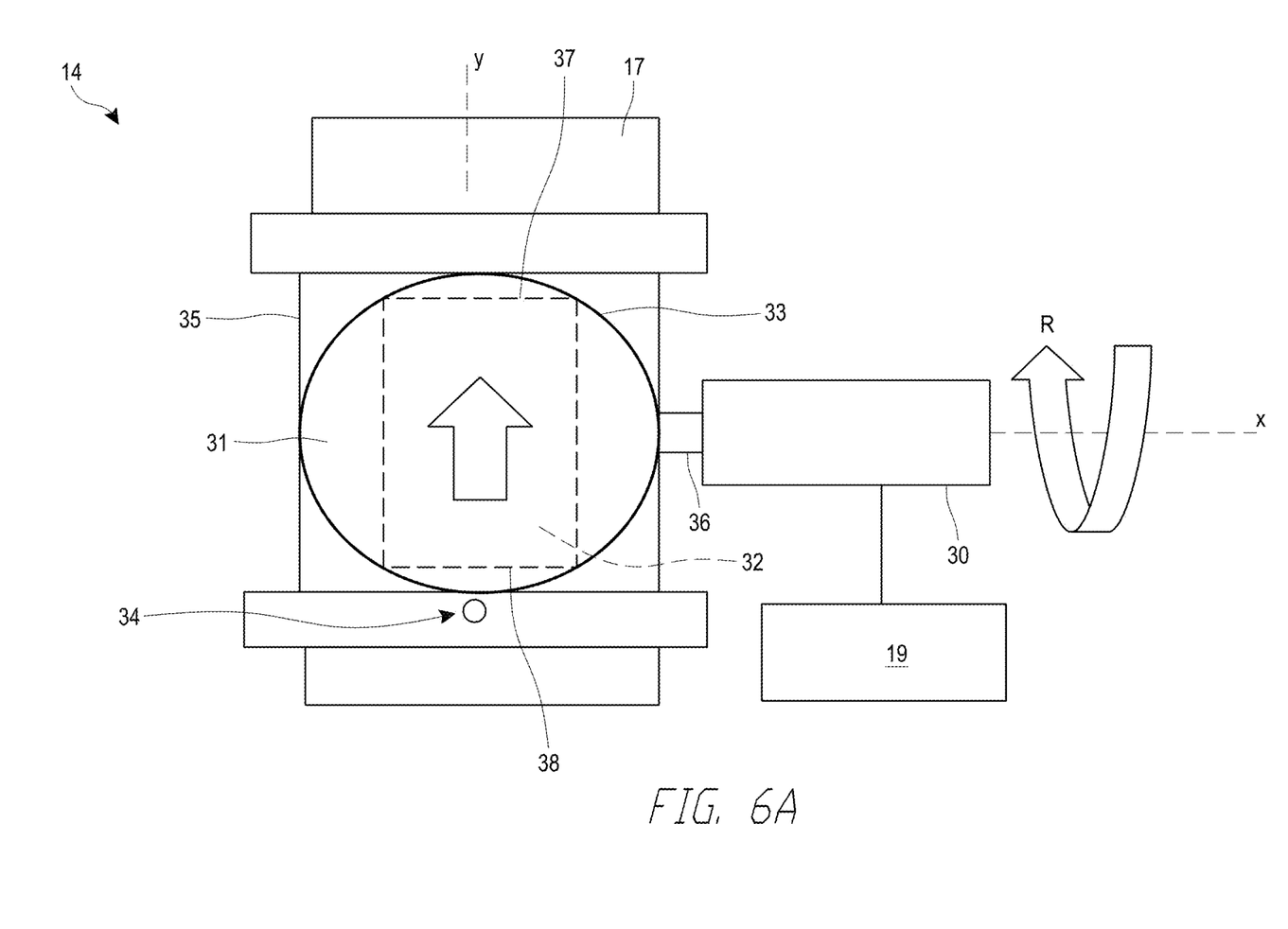
FIG. 6A is a schematic plan view of a valve in a fully open configuration, according to various embodiments disclosed herein.
Figure 6B:
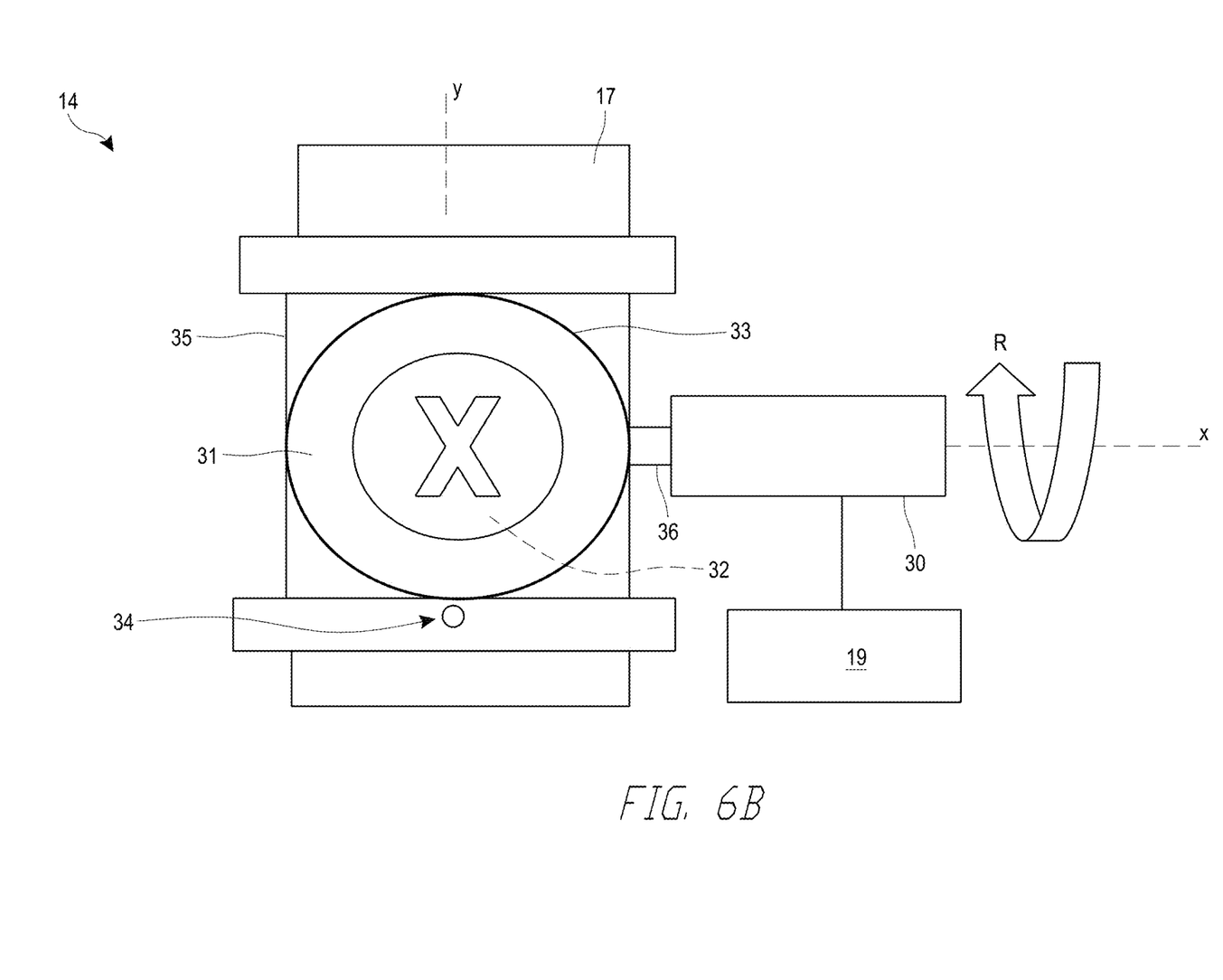
FIG. 6B is a schematic plan view of the valve of FIG. 6A in a fully closed configuration.

FIG. 6A is a schematic plan view of a valve 14 in a fully open configuration, according to various embodiments disclosed herein. FIG. 6B is a schematic plan view of the valve 14 of FIG. 6A in a fully closed configuration. In some embodiments, the valve 14 shown in FIGS. 6A-6B may be used in connection with the semiconductor processing device 1 described above in connection with FIGS. 1A-5. In other embodiments, the semiconductor processing device 1 of FIGS. 1A-5 may utilize a different type of valve, such as the throttle valve described above. Further, it should be appreciated that the valve 14 of FIGS. 6A-6B may be used in any suitable type of semiconductor processing system, including devices that are different from the semiconductor processing device 1 described above. Indeed, the valve 14 of FIGS. 6A-6B may be used in ALD devices, CVD devices, other types of deposition devices, non-deposition equipment (for example, etching equipment), or any other suitable device that utilizes variable flow conductance through a conduit or pipe.

As explained above, it can be desirable to have variable flow conductance systems for semiconductor processing devices. For example, as explained above, it can be desirable to have a high flow conductance (high flow rate) during purging of the reaction chamber in order to improve throughput and to remove excess gases before the subsequent dosing step. Further, it can be desirable to have a low flow conductance (low flow rate) during dosing so as to increase reactant gas residence time in the reaction chamber. Moreover, recent semiconductor devices utilize numerous layers (e.g., greater than 100 layers) that may have various surface topologies. For fabricating devices with a very large number of layers and complex surface topology, it can be important to further increase reactant gas residence times in the reaction chamber in order to ensure that the larger surface area is covered by the reactant layer, and at the same time it can be important to have low residence times in other phases of the process such as ALD purging. Other vapor processing may similarly call for different overall flow rates at different stages of the process. Accordingly, there remains a continuing demand for improved variable conductance devices for semiconductor processing.

The valve 14 can comprise a valve particularly suited for variable conductor processing and/or processing in a deposition reactor where the valve is subject to adverse reactions (such as layer build-up that can close the valve) by exposure to the reaction gases, particularly in the exhaust lines of a reactor. In the illustrated embodiment, the valve 14 comprises a ball valve having a rounded valve body 31 with a bore 32 provided through the valve body 31. In the illustrated embodiment, the rounded valve body 31 comprises a ball-shaped (e.g., approximately spherical) member. A flange 35 can be provided on or around the exhaust line 17. The valve body 31 can be seated within the flange 35 with a gap provided between the valve body 31 and an inner surface of the flange 35 so as to allow rotation of the valve body 31 relative to the flange 35. A motor 30 can be operably coupled with the valve body 31 by way of a motor output shaft 36. For example, the output shaft 36 can be welded or otherwise mechanically connected to the valve body 31. When activated, the motor 30 can impart rotation to the output shaft 36 and, in turn, to the valve body 31 to cause the valve body 31 to rotate R about a longitudinal or rotational axis x parallel to the output shaft 36. The motor 30 can operate at high speeds (e.g., at least about 1000 rpm) to yield fast purge-dose-purge-dose cycles (e.g., one cycle in 60 ms).

As shown in FIGS. 6A-6B, the bore 32 formed through the valve body 31 can be oriented non-parallel to (e.g., perpendicular to) the rotational or longitudinal axis x of the motor 30. In FIG. 6A, the motor 30 can position the bore 32 such that the bore 32 is parallel to a flow axis y of the exhaust line 17. When the bore 32 is parallel to the flow axis y of the exhaust line 17, the valve 14 can be considered to be in a maximum flow conductance state, in which the valve 14 is fully open to permit gases to flow through the exhaust line 17. By contrast, in FIG. 6B, the motor 30 can position the bore 32 such that the bore 32 is oriented perpendicular to the flow axis y of the exhaust line 17. In the arrangement of FIG. 6B, the perpendicularly-oriented bore 32 can block substantially all gases from flowing through the valve 14 and the exhaust line 17. Thus, when the bore 32 is oriented perpendicular to the flow axis y of the exhaust line 17, the valve 14 can be considered to be in a minimum flow conductance state, in which the valve 14 substantially blocks gases from flowing through the exhaust line 17. As will be clear from the description below, the valve 14 is not limited to these two states but instead can rotate, at variable rotational speeds, through an infinite number of degrees of opening.

As shown in FIGS. 6A-6B, the valve 14 can further comprise an inactive gas curtain region 33 disposed about the periphery of the valve body 31. The inactive gas curtain region 33 can comprise a region of inactive gas that is supplied through an inlet port into the gap between the flange 35 and the outer periphery of the valve body 31. The inactive gas curtain 33 can comprise an externally purged area around the valve body 31 that creates ballast around the valve body 31. When the valve 14 is in the open configuration shown in FIG. 6A, the inactive gas curtain region 33 can beneficially prevent reactant or other gases from entering the gap on the outer periphery of the valve body 31, which can reduce the risk of contamination and maintain the fast performance of the valve 14. The inactive gas curtain 33 can allow low friction rotation about the rotational axis x.

FIGS. 6A-6B illustrate two states of the valve (maximum and minimum flow conductances, respectively), but beneficially, the valve 14 can be placed in a plurality of orientations about the rotational axis x. In various embodiments, the valve body 31 and bore 32 can be placed in a continuous range of orientations or angles about the rotational axis x, e.g., in a range of 0° to 360°. The valve body 31 and bore 32 can be rotated in both directions about the rotational axis x. The valve body 31 and bore 32 can be placed in numerous orientations in which the bore 32 is exposed to the gas along the exhaust gas line 17. If the bore 32 is angled relative to the gas line 17 such that only a small area of the bore 32 is exposed to the exhaust gas line 17, then the flow rate through the valve 14 will be relatively low. If the bore 32 is angled relative to the gas line 17 such that a relatively large area of the bore 32 is exposed to the exhaust gas line, then the flow rate through the valve 14 will be higher. The motor 30 can precisely control the orientation of the valve body 31 and bore 32 about the rotational axis x, and this orientation can be correlated with flow rates through the bore 32. Beneficially, therefore, the ability to orient the bore 32 at a plurality of angles relative to the rotational axis x, the valve 14 shown in FIGS. 6A-6B can provide for variable flow conductances through the exhaust gas line 17. In some embodiments, the valve 14 can provide for a continuous of angles about the rotational axis x, and accordingly a continuous range of flow rates through the valve 14 and gas line 17.

To control the orientation of the valve body 31 and bore 32, an orientation sensor 34 can be provided on the flange 35 near the valve body 31. The orientation sensor 34 can remain stationary as the valve body 31 rotates. The orientation sensor 34 can measure the orientation by sensing the leading edge 37 of the bore 32, the trailing edge 38 of the bore, and regions of the bore 32 between the leading and trailing edges 37, 38. In various embodiments, the orientation sensor 34 can comprise a magnetic sensor, but other types of sensors may be used. In various embodiments, for example, a motor encoder can be used to sense the orientation of the valve body 31. The control system 19 can also be used to control the orientation of the valve body 31 and bore 32. For example, the control system 19 can comprise processing electronics configured to control the operation of the motor 30 and/or to receive signals transduced by the orientation sensor 34. In some embodiments, the control system 19 can utilize feedback control techniques, in which an orientation set point for the valve 14 is provided, which can correspond to a desired flow conductance. The control system 19 can receive a signal from the orientation sensor 34 representative of the current orientation of the valve body 31 and bore 32. Based on the difference between the orientation set point and the current orientation, the control system can utilize various control techniques (including, e.g., PID control techniques) to send an instruction signal to the motor 30 to cause the motor 30 to rotate the valve body 31 to the desired orientation set point corresponding to the desired flow conductance.

During a purge cycle or state, the control system 19 can instruct the motor 30 to rotate the valve body 31 and bore 32 at one or a plurality of orientations corresponding to a desired or pre-programmed relatively high flow conductance. Thus, during a particular phase (dosing or purging), the average conductance can be changed by controlling the speed of rotation. For example, the rotational speed of the valve body 31 and bore 32 can be slowed during dosing to reduce the average conductance, and/or increased during purging to increase the average conductance. In some embodiments, the motor 30 can continuously rotate the valve body 31 and bore 32 during purge and dose states. For example, the motor 30 can rotate the valve body 31 and bore 32 at higher velocities during purging, and/or can expose a larger area of the bore 32 to the exhaust line 17 during purging. In some embodiments, the motor 30 can rotate the valve body 31 and bore 32 at lower velocities during dosing, and/or can expose a smaller area of the bore 32 to the exhaust line 17 during dosing. In some embodiments, the motor 30 can stop the rotation of the valve body 31 and bore at a particular orientation during purging and/or dosing. For example, during purging, the motor 30 may stop rotating the valve body 31 and bore 32 at an orientation that maximizes or increases flow conductance (e.g., as shown in FIG. 6A). As another example, during dosing, the motor 30 may stop rotating the valve body 31 and bore 32 at an orientation that minimizes or reduces flow conductance so as to increase reactant vapor residence time in the reaction chamber 2. As explained above, the control system 19 can utilize feedback control techniques based on the signals from the orientation sensor 34.

Figure 7:
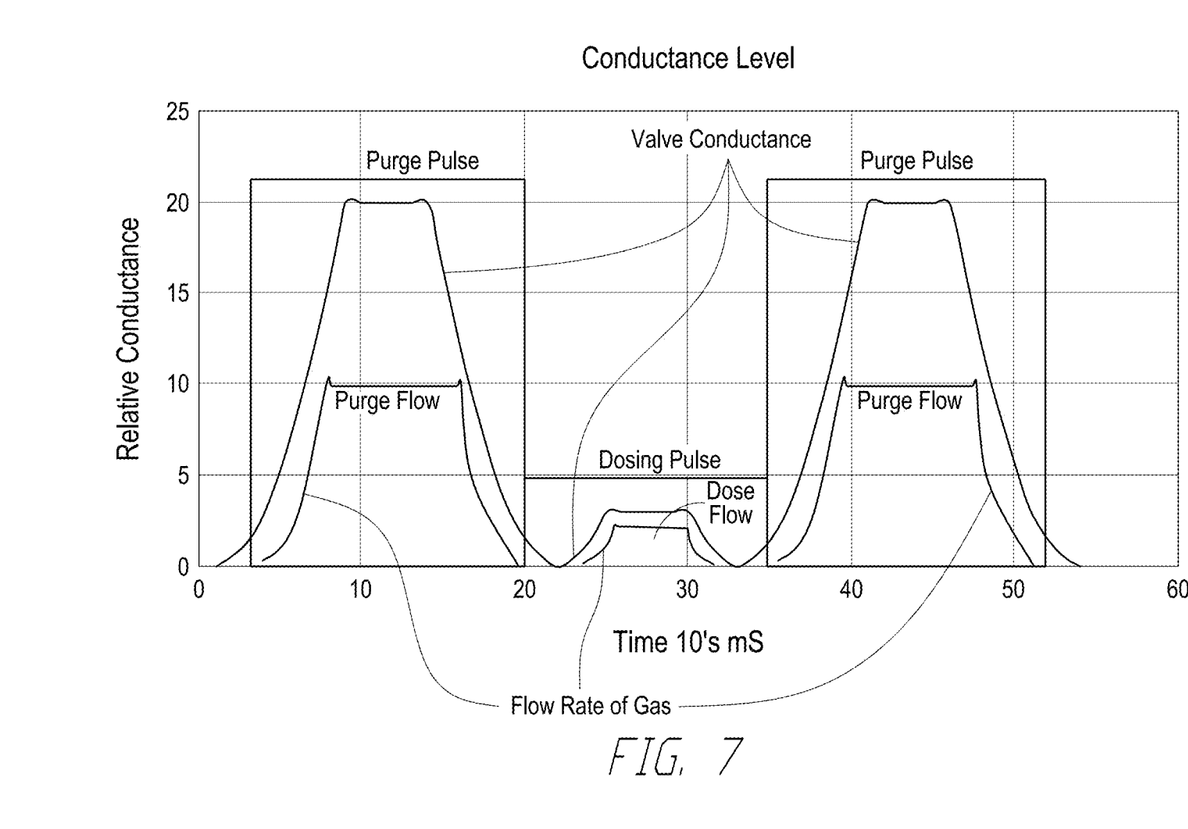
FIG. 7 is a graph of relative flow conductance over time for a purge cycle, followed by a dose cycle, followed by another purge cycle, using the valve shown in FIGS. 6A-6B.

FIG. 7 is a graph of relative flow conductance over time for a purge cycle, followed by a dose cycle, followed by another purge cycle, using the valve 14 shown in FIGS. 6A-6B. As shown for the purge pulse, the control system 19 can instruct the motor 30 to place the valve 14 at one or a plurality of conductance settings that increases or maximizes flow conductance, e.g., the orientation shown in FIG. 6A in which the bore 32 is generally parallel to the flow axis y of the exhaust gas line 17. Providing high flow conductance setting(s) during purge results in the high flow rates during the purging cycles. As explained herein, the control system 19 and motor 30 can control the angular velocity and acceleration of the valve body 31 and bore 32 about the rotational axis x during a particular processing phase (dose or puge) and/or between processing phases. During purging, the motor 30 can rotate the valve body 31 at a high velocity in order to terminate the purge cycle before the next dosing cycle.

During dosing, by contrast, the valve 14 can be set at one or more relatively low flow conductance setting(s), resulting in relatively low flow rates as shown in FIG. 7. For example, the bore 32 can be moved in a manner that reduces the flow through the valve 14. For example, in some embodiments, the velocity of rotation of the valve 14 can be slowed and/or the area of the bore 32 exposed to the exhaust line 17 can be made relatively small, e.g., at a relatively large angle (but less than 90°) relative to the flow axis y at various orientations of the valve body 31 during dosing. The relatively large angles and/or low angular velocities can expose a small portion of the bore 32 to the exhaust line 17 for a longer period of time, resulting in low flow rates and longer residence times during dosing. Furthermore, during dosing, the angular velocity of the valve body 31 and bore 32 can be relatively low so as to cause the reactant gas in the reaction chamber 2 to become relatively stagnant, causing an increased residence time in the chamber 2 and improved formation of the layers.

Accordingly, the ball valve 14 shown in FIGS. 6A-7 can beneficially provide high-speed, variable flow conductance for any suitable type of semiconductor processing device. In some embodiments, the valve 14 of FIGS. 6A-7 can be placed along the exhaust line 17 of a semiconductor vapor phase processing device. In some embodiments, the device is a vapor deposition device. In some embodiments, the device is a cyclical CVD device. In some embodiments, the device is an ALD device. Further, the inactive gas curtain 33 can beneficially block reactant gases from contaminating the outer periphery of the valve body 31 when the bore 32 is at least partially exposed to the exhaust line 17.

Although the foregoing has been described in detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention. Moreover, not all of the features, aspects and advantages described herein above are necessarily required to practice the present invention.

What is claimed is:

1. An atomic layer deposition (ALD) device comprising:
    a reactor assembly comprising a reaction chamber sized to receive a substrate therein;
    an exhaust line in fluid communication with the reaction chamber, the exhaust line configured to transfer gas out of the reaction chamber;
    a valve disposed along the exhaust line to regulate the flow of the gas along the exhaust line, the valve having a plurality of flow conductance settings; and
    an open loop control system configured to control the operation of the valve,
    wherein, during a dose state of the ALD device, the control system is configured to send a first signal to the valve corresponding to a first non-zero flow conductance of the plurality of flow conductance settings, and
wherein, during a purge state of the ALD device, the control system is configured to send a second signal to the valve corresponding to a second non-zero flow conductance of the plurality of flow conductance settings, the first signal different from the second signal.

2. The ALD device of claim 1, wherein the second flow conductance is higher than the first flow conductance.

3. The ALD device of claim 1, wherein the first flow conductance corresponds to a first pre-programmed set point of the valve, wherein the second flow conductance corresponds to a second pre-programmed set point of the valve, wherein the control system is configured to determine the first pre-programmed set point based on a look up table (LUT) that provides a mapping between measured pressures within the reaction chamber and the plurality of flow conductance settings across a plurality of gas loads, and wherein the control system is configured to determine the second pre-programmed set point based on the LUT.

4. The ALD device of claim 3, wherein the reactor assembly comprises a loading chamber disposed below the reaction chamber, the reaction chamber substantially sealed from the loading chamber during a deposition process, the reaction chamber in fluid communication with the loading chamber during loading of the substrate into the reactor assembly.

5. The ALD device of claim 4, wherein the measured pressures of the reaction chamber are measured in the loading chamber when the reaction chamber is in fluid communication with the loading chamber.

6. The ALD device of claim 5, further comprising a susceptor configured to support the substrate and a movable arm configured to move the susceptor between the reaction chamber and the loading chamber, the susceptor disposed in the loading chamber when measured pressures are measured in the loading chamber.

7. The ALD device of claim 1, wherein the control system comprises a module controller and a valve controller, the module controller configured to control the operation of the valve controller, the valve controller configured to control the operation of the valve.

8. The ALD device of claim 7, wherein the module controller is configured to send instructions to the valve controller indicating a control mode for a deposition process and providing a control set point for the deposition process.

9. The ALD device of claim 1, wherein the ALD device is configured to perform a process having multiple phases with different overall flow rates in the different phases.

10. The ALD device of claim 1, wherein the valve comprises a ball valve.

11. The ALD device of claim 10, wherein the ball valve comprises a valve body and a bore formed through the valve body, the valve body and bore configured to rotate about a rotational axis to provide the plurality of flow conductance settings along the exhaust gas line.

12. The ALD device of claim 11, further comprising a motor configured to rotate the valve body and the bore about the rotational axis.

13. An atomic layer deposition (ALD) device comprising:
a reactor assembly comprising a reaction chamber sized to receive a substrate therein;
an exhaust line in fluid communication with the reaction chamber, the exhaust line configured to transfer gas out of the reaction chamber;
a valve disposed along the exhaust line to regulate the flow of the gas along the exhaust line, the valve having a plurality of flow conductance settings, wherein the valve comprises a ball valve, the ball valve comprising a valve body and a bore formed through the valve body, the valve body and bore configured to rotate about a rotational axis to provide the plurality of flow conductance settings along the exhaust gas line;
a control system configured to control the operation of the valve;
a motor configured to rotate the valve body and the bore about the rotational axis; and
an orientation sensor configured to sense an orientation of the bore about the rotational axis, wherein the control system is configured to control the operation of the motor based on a feedback signal transmitted the orientation sensor;
wherein, during a dose state of the ALD device, the control system is configured to send a first signal to the valve corresponding to a first flow conductance of the plurality of flow conductance settings, and
wherein, during a purge state of the ALD device, the control system is configured to send a second signal to the valve corresponding to a second flow conductance of the plurality of flow conductance settings.

14. A semiconductor processing device comprising:
a reactor assembly comprising a reaction chamber sized to receive a substrate therein;
an exhaust line in fluid communication with the reaction chamber, the exhaust line configured to transfer gas out of the reaction chamber;
a valve disposed along the exhaust line to regulate the flow of the gas along the exhaust line, the valve controllable to a plurality of set points corresponding to a plurality of flow conductances; and
a control system configured to operate in an open loop control mode to control the operation of the valve,
wherein, during a dose state of the ALD device, the control system is configured to send a first signal to the valve to place the valve at a first pre-programmed set point of the plurality of set points corresponding to a first non-zero flow conductance of the plurality of flow conductances, and wherein, during a purge state of the ALD device, the control system is configured to send a second signal to the valve to place the valve at a second pre-programmed set point of the plurality of set points corresponding to a second non-zero flow conductance of the plurality of flow conductances.

15. The device of claim 14, wherein the semiconductor processing device is configured to perform a process having multiple phases with different overall flow rates in the different phases.

16. The device of claim 15, wherein the control system is configured to determine the first pre-programmed set point based on a look up table (LUT) that provides a mapping between measured pressures within the reaction chamber and the plurality of set points across a plurality of gas loads, and wherein the control system is configured to determine the second pre-programmed set point based on the LUT.

* * * * *